(12) United States Patent
Matsukawa

(10) Patent No.: US 10,666,215 B2
(45) Date of Patent: *May 26, 2020

(54) AMBIENT SOUND ACTIVATED DEVICE

(71) Applicant: Sony Interactive Entertainment Inc., Tokyo (JP)

(72) Inventor: Takeo Matsukawa, San Jose, CA (US)

(73) Assignee: SONY COMPUTER ENTERTAINMENT INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/452,009

(22) Filed: Jun. 25, 2019

(65) Prior Publication Data

US 2020/0036354 A1 Jan. 30, 2020

Related U.S. Application Data

(63) Continuation of application No. 16/044,418, filed on Jul. 24, 2018, now Pat. No. 10,361,673.

(51) Int. Cl.
| | |
|---|---|
| *H04R 3/00* | (2006.01) |
| *H04R 29/00* | (2006.01) |
| *H03G 3/20* | (2006.01) |
| *G10K 11/16* | (2006.01) |
| *H03G 3/32* | (2006.01) |
| *H04R 1/10* | (2006.01) |
| *H04S 3/00* | (2006.01) |
| *H04R 5/033* | (2006.01) |

(52) U.S. Cl.
CPC ............. *H03G 3/32* (2013.01); *H04R 1/1091* (2013.01); *H04R 5/033* (2013.01); *H04S 3/004* (2013.01); *H04S 2400/01* (2013.01)

(58) Field of Classification Search
CPC ...... H04R 1/10; H04R 1/1083; H04R 1/1091; H04R 3/00; H04R 3/005; H04R 3/12; H04R 5/00; H04R 5/02; H04R 5/04; H04R 5/033; H04R 27/00; H04R 2410/01; H04R 2410/05; H04R 29/00; H04R 29/001; H04R 29/004; H04R 2420/01; H04R 2499/11; H04S 2400/01; H04S 2400/15; H04S 3/004; G10K 11/17881; G10K 2210/108; G10K 2210/1081; H03G 3/20; H03G 3/24; H03G 3/32

See application file for complete search history.

(56) References Cited

U.S. PATENT DOCUMENTS

| | | |
|---|---|---|
| 5,448,637 A | 9/1995 | Yamaguchi et al. |
| 5,715,321 A | 2/1998 | Andrea et al. |

(Continued)

OTHER PUBLICATIONS

Gil Keren et al., "Convolutional RNN: an Enhanced Model for Extracting Features from Sequential Data", arXiv:1602.05875, Feb. 18, 2016.

(Continued)

*Primary Examiner* — Thang V Tran
(74) *Attorney, Agent, or Firm* — JDI Patent; Joshua Isenberg; Robert Pullman

(57) ABSTRACT

In device having at least one microphone and one or more speakers, environmental sound may be recorded using the microphone, classified and mixed with source media sound to produce a mixed sound depending on the classification. The mixed sound may then be played over the one or more speakers.

32 Claims, 9 Drawing Sheets

(56) References Cited

U.S. PATENT DOCUMENTS

| | | | |
|---|---|---|---|
| 5,815,582 | A | 9/1998 | Claybaugh et al. |
| 6,771,780 | B2 | 8/2004 | Hong et al. |
| 7,430,300 | B2 | 9/2008 | Vosburgh et al. |
| 7,512,245 | B2 | 3/2009 | Rasmussen et al. |
| 7,545,926 | B2 | 6/2009 | Mao |
| 7,903,826 | B2 | 3/2011 | Boersma |
| 8,199,942 | B2 | 6/2012 | Mao |
| 8,676,574 | B2 | 3/2014 | Kalinli |
| 9,357,320 | B2 | 5/2016 | Getter |
| 9,937,420 | B2 | 4/2018 | Matsukawa |
| 10,155,154 | B2 | 12/2018 | Bashkirov et al. |
| 10,361,673 | B1 * | 7/2019 | Matsukawa ............ H04R 5/033 |
| 2006/0013409 | A1 | 1/2006 | Desloge |
| 2006/0083388 | A1 | 4/2006 | Rothschild |
| 2006/0204016 | A1 | 9/2006 | Hong et al. |
| 2006/0233389 | A1 | 10/2006 | Mao et al. |
| 2006/0239471 | A1 | 10/2006 | Mao et al. |
| 2007/0025562 | A1 | 2/2007 | Zalewski et al. |
| 2007/0260340 | A1 | 11/2007 | Mao |
| 2007/0274535 | A1 | 11/2007 | Mao |
| 2008/0165988 | A1 | 7/2008 | Terlizzi et al. |
| 2008/0292111 | A1 | 11/2008 | Park |
| 2009/0022343 | A1 | 1/2009 | Van et al. |
| 2009/0196443 | A1 | 8/2009 | Her et al. |
| 2009/0196454 | A1 | 8/2009 | Her et al. |
| 2009/0252344 | A1 | 10/2009 | Mao et al. |
| 2009/0252355 | A1 | 10/2009 | Mao |
| 2009/0268931 | A1 | 10/2009 | Andrea et al. |
| 2009/0316929 | A1 | 12/2009 | Tashev et al. |
| 2010/0027820 | A1 | 2/2010 | Kates |
| 2010/0166204 | A1 | 7/2010 | Yanagishita et al. |
| 2010/0215198 | A1 | 8/2010 | Ngia et al. |
| 2010/0278365 | A1 | 11/2010 | Lotito et al. |
| 2010/0316225 | A1 | 12/2010 | Saito et al. |
| 2011/0007927 | A1 | 1/2011 | Hedrick et al. |
| 2011/0081036 | A1 | 4/2011 | Brown |
| 2011/0150248 | A1 | 6/2011 | Macours |
| 2011/0206217 | A1 | 8/2011 | Weis |
| 2014/0185828 | A1 | 7/2014 | Helbling |
| 2017/0087457 | A1 | 3/2017 | Matsukawa |
| 2017/0188173 | A1 | 6/2017 | Ranieri et al. |
| 2018/0132052 | A1 | 5/2018 | Muench et al. |
| 2018/0193728 | A1 | 7/2018 | Bashkirov et al. |
| 2018/0221763 | A1 | 8/2018 | Matsukawa |
| 2018/0295463 | A1 | 10/2018 | Eronen et al. |

OTHER PUBLICATIONS

Hochreiter & Schmidhuber "Long Short-term memory" Neural Computation 9(8):1735-1780 (1997).

Liu et al., "A Recursive Recurrent Neural Network for Statistical Machine Translation", ACL, 2014.

Non-final Office Action dated Oct. 14, 2011 for U.S. Appl. No. 12/099,022.

Non-Final Office Action for U.S. Appl. No. 16/044,418, dated Nov. 19, 2018.

Notice of Allowance for U.S. Appl. No. 16/044,418, dated Mar. 13, 2019.

Sepp Hochreiter et al., "Long Short-Term Memory", Neural Computation, 9(8) 1735-1780, 1997, Cambridge, MA.

Shuichi Sakamoto et al., "Sound attenuation devices for dogs barking (estimation of aperture ratio and experimental study of silencer)", International Journal of Mechanical Engineering and Applications 2014; 2(1): 18-24 Published online Mar. 20, 2014 (http://www.sciencepublishinggroup.com/j/ijmea) doi: 10.11648/j.ijmea.20140201.14.

Tomas Mikolov et al., "Recurrent neural network based language model", Interspeech 2010, 11th Annual Conference of the International Speech Communication Association, Makuhari, Chiba, Japan, Sep. 26-30, 2010.

U.S. Appl. No. 16/044,418 entitled "Ambient Sound Activated Headphone" to Takeo Matsukawa filed Jul. 24, 2018.

International Search Report and Written Opinion dated Oct. 18, 2019 for International Patent Application No. PCT/US2019/041238.

* cited by examiner

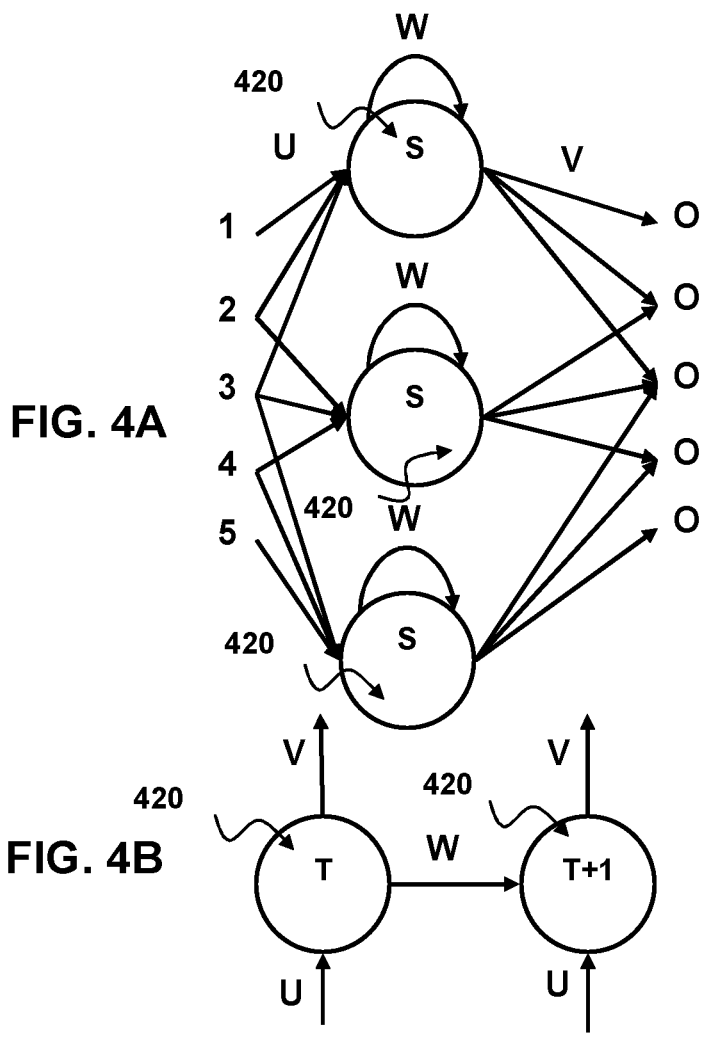
FIG. 4A
FIG. 4B
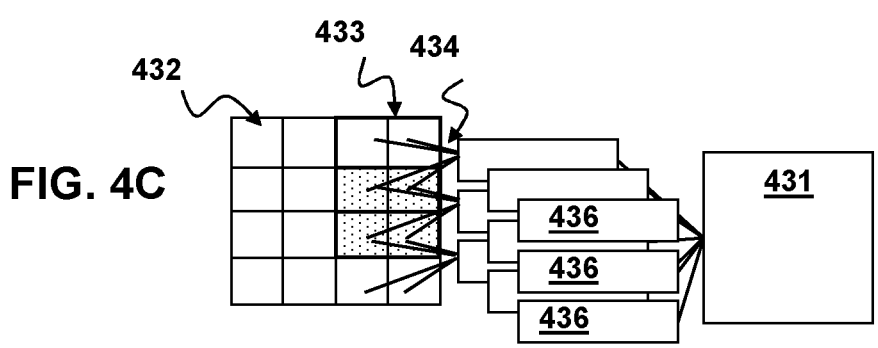
FIG. 4C

AMBIENT SOUND ACTIVATED DEVICE

CLAIM OF PRIORITY

This application is a continuation of U.S. patent application Ser. No. 16/044,418, filed Jul. 24, 2018, the entire contents of which are incorporated herein by reference.

FIELD OF THE DISCLOSURE

Aspects of the present disclosure are related to computer gaming and more specifically to audio headsets used in computer gaming.

BACKGROUND OF THE INVENTION

Many video game systems make use of a headset for audio communication between a person playing the game and others who can communicate with the player's gaming console over a computer network. Many such headsets can communicate wirelessly with a gaming console. Such headsets typically contain one or more audio speakers to play sounds generated by the game console. Such headsets may also contain a near-field microphone to record user speech for applications such as audio/video (A/V) chat.

Multi-channel sound, e.g., surround sound, is often used to enhance the audio portion of a user's gaming experience. Unfortunately, the massive sound field from the headset tends to cancel out environmental sounds, e.g., speech from others in the room, ringing phones, doorbells and the like. To attract attention, it is often necessary to tap the user on the shoulder or otherwise distract him from the game. The user may then have to remove the headset in order to engage in conversation.

It is within this context that embodiments of the present invention arise.

BRIEF DESCRIPTION OF THE DRAWINGS

The teachings of the present invention can be readily understood by considering the following detailed description in conjunction with the accompanying drawings, in which:

FIG. 4A is a simplified node diagram of a recurrent neural network for according to aspects of the present disclosure.

FIG. 4B is a simplified node diagram of an unfolded recurrent neural network for according to aspects of the present disclosure.

FIG. 4C is a simplified diagram of a convolutional neural network for according to aspects of the present disclosure.

DESCRIPTION OF THE SPECIFIC EMBODIMENTS

Figure 1:
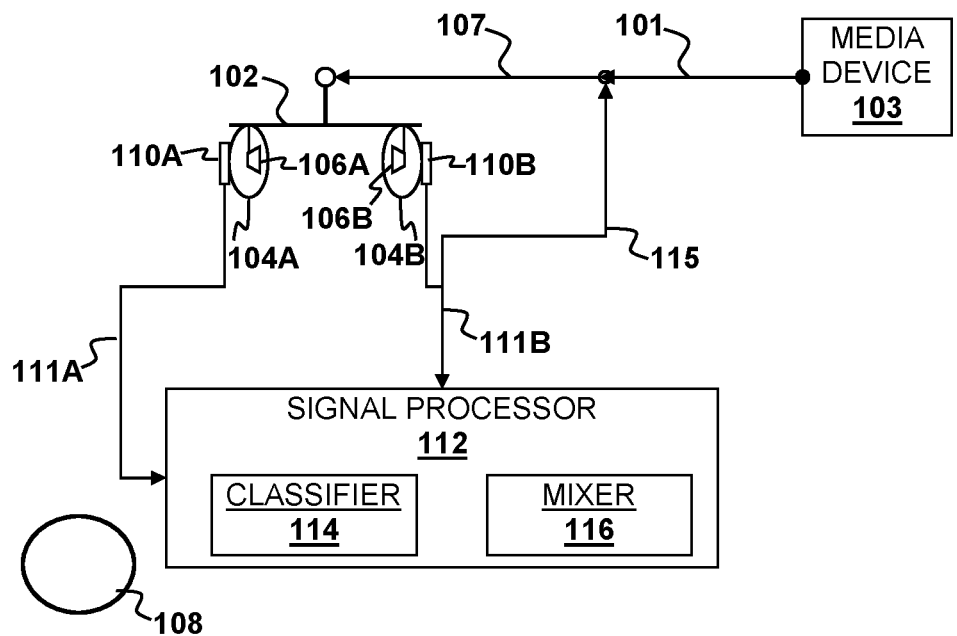
FIG. 1 is a schematic diagram illustrating classification and selective mixing of sound according to an embodiment of the present invention.

Although the following detailed description contains many specific details for the purposes of illustration, anyone of ordinary skill in the art will appreciate that many variations and alterations to the following details are within the scope of the invention. Accordingly, examples of embodiments of the invention described below are set forth without any loss of generality to, and without imposing limitations upon, the claimed invention.

While numerous specific details are set forth in order to provide a thorough understanding of embodiments of the invention, it will be understood by those skilled in the art that other embodiments may be practiced without these specific details. In other instances, well-known methods, procedures, components and circuits have not been described in detail so as not to obscure the present invention. Some portions of the description herein are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm, as used herein, is a self-consistent sequence of actions or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

Unless specifically stated or otherwise as apparent from the following discussion, it is to be appreciated that throughout the description, discussions utilizing terms such as "processing", "computing", "converting", "reconciling", "determining" or "identifying," refer to the actions and processes of a computer platform which is an electronic computing device that includes a processor which manipulates and transforms data represented as physical (e.g., electronic) quantities within the processor's registers and accessible platform memories into other data similarly represented as physical quantities within the computer platform memories, processor registers, or display screen.

A computer program may be stored in a computer readable storage medium, such as, but not limited to, any type of disk including floppy disks, optical disks (e.g., compact disc read only memory (CD-ROMs), digital video discs (DVDs), Blu-Ray Discs™, etc.), and magnetic-optical disks, read-only memories (ROMs), random access memories (RAMs), EPROMs, EEPROMs, magnetic or optical cards, flash memories, or any other type of non-transitory media suitable for storing electronic instructions.

The terms "coupled" and "connected," along with their derivatives, may be used herein to describe structural relationships between components of the apparatus for performing the operations herein. It should be understood that these terms are not intended as synonyms for each other. Rather, in particular embodiments, "connected" may be used to indicate that two or more elements are in direct physical or electrical contact with each other. In some instances, "connected", "connection", and their derivatives are used to indicate a logical relationship, e.g., between node layers in a neural network. "Coupled" may be used to indicated that two or more elements are in either direct or indirect (with other intervening elements between them) physical or electrical contact with each other, and/or that the two or more elements co-operate or communicate with each other (e.g., as in a cause an effect relationship).

According to an aspect of the present disclosure, the disadvantages associated with the prior art may be overcome through the use of classification of sound sources with a neural network. By way of example, the solution to the problem may be understood by referring to the schematic diagram shown in FIG. 1. A headset 102 having two earphones 104A, 104B receives a multi-channel source media sound signal 101 (e.g., surround sound) from a media device 103. As used, herein the term "source media sound" refers to sounds generated in response to predetermined coded signals other than those generated in response to sounds recorded by the microphone(s). By way of example, source media sound may include, but are not limited to, sound generated by a television system, home theater system, stereo system, digital video recorder, video cassette recorder, video game console, personal computer, portable music or video player or handheld video game device.

As used herein, the term "multi-channel audio" refers to a variety of techniques for expanding and enriching the sound of audio playback by recording additional sound channels that can be reproduced on additional speakers. As used herein, the term "surround sound" refers to the application of multi-channel audio to channels "surrounding" the audience (generally some combination of left surround, right surround, and back surround) as opposed to "screen channels" (center, [front] left, and [front] right). Surround sound technology is used in cinema and "home theater" systems, games consoles and PCs, and a growing number of other applications. Consumer surround sound formats include sound on videocassettes, Video DVDs, and HDTV broadcasts encoded as Dolby Pro Logic, Dolby Digital, or DTS. Other surround sound formats include the DVD-Audio (DVD-A) and Super Audio CD (SACD) formats, and MP3 Surround.

Surround sound hardware is mostly used by movie productions and sophisticated video games. However, some consumer camcorders (particularly DVD-R based models from Sony) have surround sound capability either built-in or available as an add-on. Some consumer electronic devices (AV receivers, stereos, and computer soundcards) have digital signal processors or digital audio processors built into them to simulate surround sound from stereo sources.

It is noted that there are many different possible microphone and speaker configurations that are consistent with the above teachings. For example, for a five channel audio signal, the headset may be configured with five speakers instead of two, with each speaker being dedicated to a different channel. The number of channels for sound need not be the same as the number of speakers in the headset. Any number of channels greater than one may be used depending on the particular multi-channel sound format being used.

Examples of suitable multi-channel sound formats include, but are not limited to, stereo, 3.0 Channel Surround (analog matrixed: Dolby Surround), 4.0 Channel Surround (analog matrixed/discrete: Quadraphonic), 4.0 Channel Surround (analog matrixed: Dolby Pro Logic), 5.1 Channel Surround (3-2 Stereo)(analog matrixed: Dolby Pro Logic II), 5.1 Channel Surround (3-2 Stereo)(digital discrete: Dolby Digital, DTS, SDDS), 6.1 Channel Surround (analog matrixed: Dolby Pro Logic IIx), 6.1 Channel Surround (digital partially discrete: Dolby Digital EX), 6.1 Channel Surround (digital discrete: DTS-ES), 7.1 Channel Surround (digital discrete: Dolby Digital Plus, DTS-HD, Dolby TrueHD), 10.2 Channel Surround, 22.2 Channel Surround and Infinite Channel Surround (Ambisonics).

In the multi-channel sound format notation used above, the number before the decimal point in a channel format indicates the number of full range channels and a 1 or 0 after the decimal indicates the presence or absence limited range low frequency effects (LFE) channel. By way of example, if a 5.1 channel surround sound format is used, there are five full range channels plus a limited range LFE channel. By contrast, in a 3.0 channel format, there are three full range channels and there is no LFE channel.

Each of the earphones includes one or more speakers 106A, 106B. The different signal channels in the multi-channel audio signal 101 are distributed among the speakers 106A, 106B to produce enhanced sound. Normally, this sound would overwhelm any environmental sound. As used herein, the term "environmental sound" refers to sounds, other than source media sounds, generated from sound sources in the environment in which the headset 102 is used. For example, if the headset 102 is used in a room, environment sounds include sounds generated within the room. By way of example, an environmental sound source 108 may be another person in the room or a ringing telephone.

To allow a user to realistically hear targeted sounds from the environmental source 108 the headset 102 includes one or more microphones. In particular, the headset may include far-field microphones 110A, 110B mounted to the earphones 104A, 104B. The microphones 110A, 110B are configured to detect environmental sound and produce microphone signals 111A, 111B in response thereto. By way of example, the microphones 110A, 110B may be positioned and oriented on the earphones 104A, 104B such that they primarily receive sounds originating outside the earphones, even if a user is wearing the headset.

In certain embodiments of the invention, the microphones 110A, 110B may be far-field microphones. It is further noted that two or more microphones may be placed in close proximity to each other (e.g., within about two centimeters) in an array located on one of the earphones. Although two microphones are depicted in FIG. 1 for the purposes of example, aspects of the present disclosure are not limited to only such implementations. For example, active noise cancellation systems typically have four or five microphones on headset, e.g., two in each earphone and a separate one for voice. Aspects of the present disclosure include implementations that use signals from all such microphones in a noise cancellation system.

The microphone signals 111A, 111B may be coupled to a signal processor 112 that is configured to detect and record sounds originating from the environmental sound source 108. The signal processor 112 may be implemented in hardware or software or some combination of hardware and software. The signal processor 112 may include sound filtering to remove background noise or other undesired sound as discussed below. The signal processor 112 may generally include circuitry and/or processing logic that converts transduced acoustic signals from the microphones into corresponding digital signals. By way of example, and not by way of limitation, such conversion may include analog-to-digital conversion (ADC) and, in some implementations, data compression. The signal processor 112 may also include circuitry and/or processing logic that converts digital signals into analog signals suitable for driving the speakers 106A, 106B. Such conversion may include digital to analog conversion (DAC) and, in some implementations data decompression. The signal processor 112 may include a standard commercially available audio coder/decoder (codec) to implement these functions. Such a codec may be implemented in hardware or software or some combination of hardware and software. Some implementations may use a software codec, e.g., MP3, SBC, AAC, to compress digitized audio signals to reduce the amount of data or decompress compressed digitized audio signals.

The digital signal processor 112 may further include hardware circuitry and/or processor executable instructions configured to implement a classifier 114 and a mixer 116. The classifier 114 analyzes digitized audio signals to classify sources of environmental sound in the corresponding audio signals. The mixer 116 determines whether to mix the environmental sound into the audio played by the speakers 106A 106B based on the classification of the source.

Where two or more microphones are used, an environmental sound signal may be generated from environmental sound transduced at the microphones 110A, 110B in both earphones. The environmental sound signals may take into account differences in sound intensity arriving at the microphones 110A, 110B. For example, in FIG. 1, the environmental sound source 108 is slightly closer to microphone 110A than to microphone 110B. Consequently, it is reasonable to expect that the sound intensity at microphone 110A is higher than at microphone 110B. The difference in sound intensity between the two microphones may be encoded in the environmental sound signal. There are a number of different ways of generating the environmental sound signal to take into account differences in sound intensity due to the different locations of the microphones 110A, 110B, e.g., using blind source separation or semi-blind source separation.

Locational Information Determination in Environmental Sound

In some embodiments, the two microphones 110A, 110B may be mounted on each side of an earphone and structured as two-microphone array. Array beam-forming or maybe simple coherence based sound-detection technology (so called "music" algorithm) may be used to detect the sound and determine the direction from sound source origination to the array geometry center as well.

By way of example, and without loss of generality, the environmental sound signal may be a discrete time domain input signal $x_m(t)$ produced from an array of two or more microphones. A listening direction may be determined for the microphone array. The listening direction may be used in a semi-blind source separation to select the finite impulse response filter coefficients $b_0, b_1, \ldots, b_N$ to separate out different sound sources from input signal $x_m(t)$. One or more fractional delays may optionally be applied to selected input signals $x_m(t)$ other than an input signal $x_0(t)$ from a reference microphone $M_0$. Each fractional delay may be selected to optimize a signal to noise ratio of a discrete time domain output signal $y(t)$ from the microphone array. The fractional delays may be selected to such that a signal from the reference microphone $M_0$ is first in time relative to signals from the other microphone(s) of the array. A fractional time delay $\Delta$ may optionally be introduced into an output signal $y(t)$ so that: $y(t+\Delta)=x(t+\Delta)*b_0+x(t-1+\Delta)*b_1+x(t-2+\Delta)*b_2+ \ldots +x(t-N+\Delta)b_N$, where $\Delta$ is between zero and ±1 and $b_0, b_1, b_2 b_N$ are finite impulse response filter coefficients.

Fractional delays and semi-blind source separation and other techniques for generating an environmental sound signal to take into account differences in sound intensity due to the different locations of the microphones are described in detail in commonly-assigned US Patent Application publications 20060233389, 200620239471, 20070025562, and 20070260340, the entire contents of which are incorporated herein by reference for all purposes.

According to aspects of the present disclosure, information regarding the direction and distance of a sound origination point with respect to the microphone array may be provided as a feature vector to a classification neural network. Alternatively, the distance and direction information may be concatenated with other input vectors and provided to a classification neural network. In some implementations, the signal processor 112 may implement microphone beam forming to determine a location of the sound origination point, e.g., both a distance and direction to the sound origination point. For some applications, determining direction may be sufficient. In some implementations, the signal processor 112 may determine whether sound source is moving toward the user, e.g., through time of flight analysis and then use machine learning to increase confidence. For example, there might be higher confidence if microphone picks up someone saying the user's name. Machine learning could also detect whether a conversation is ongoing or ended.

Auditory Attention Features Extraction from Environmental Sound

Figure 3A:
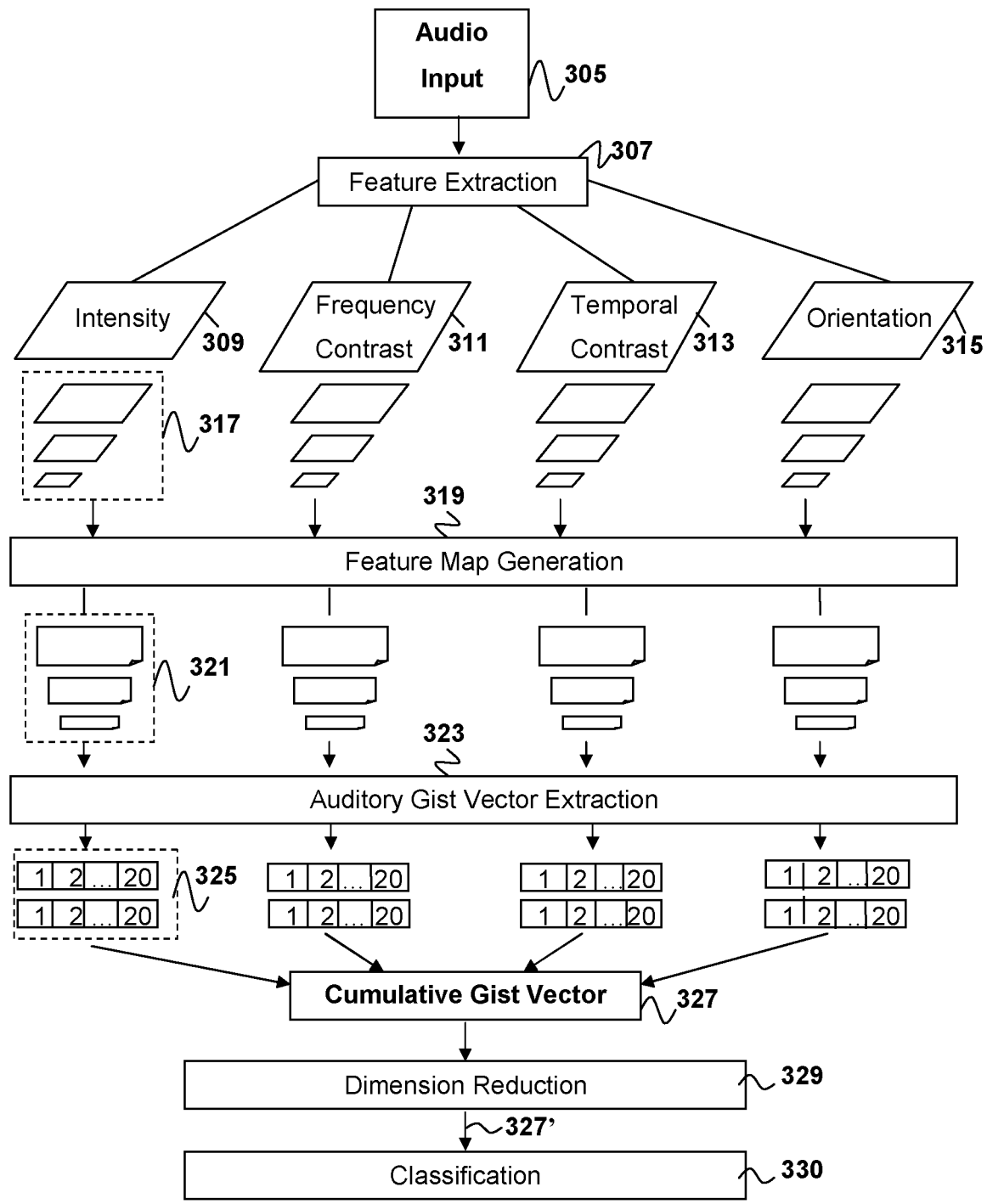
FIG. 3A is a is a flow diagram illustrating a method for extracting auditory attention cues according to an aspect of the present disclosure
Figure 3B:
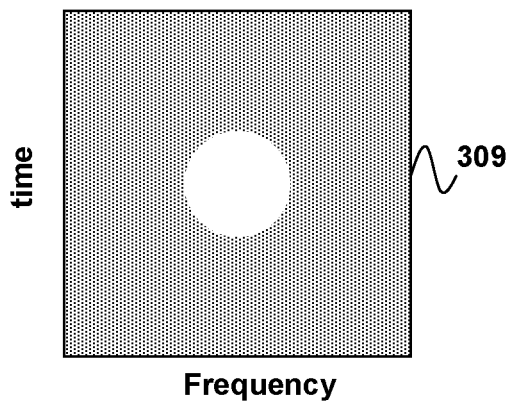
FIGS. 3B-3F are schematic diagrams illustrating examples of spectro-temporal receptive filters that can be used in aspects of the present disclosure.
Figure 3C:
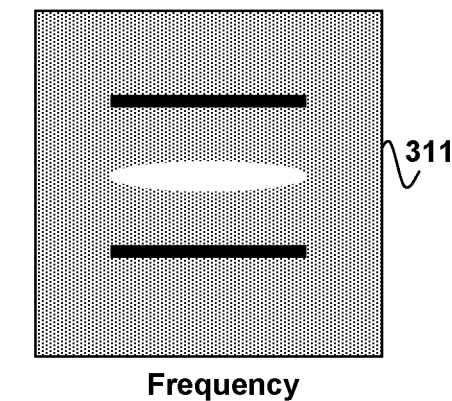
Figure 3D:
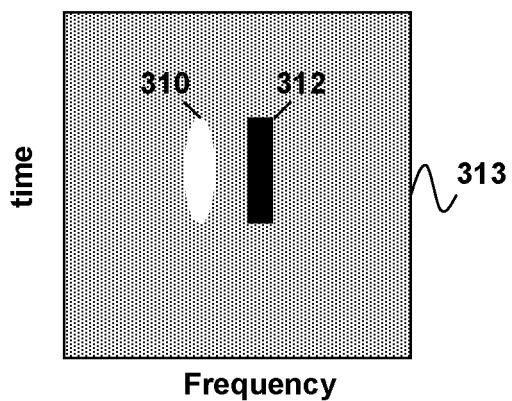

In addition to extracting locational information, a headphone system according to aspects of the present disclosure may extract audio attention features from inputs. FIG. 3A depicts a method for generating audio attention features from an audio input 305. By way of example, and not by way of limitation, the audio input 305 may include a pre-processed audio spectrum or a recoded window of an audio signal that has undergone processing before audio attention feature generation. Such pre-processing may mimic the processing that sound undergoes in human hearing. In some alternative embodiments if the specific target is defined like a human voice, noise cancelation or source separation pre-processing may be used for sound of interest identification Additionally low level features may be processed using other filtering software such as, without limitation, filter-bank, to further improve performance. Auditory attention can be captured by or voluntarily directed to a wide variety of acoustical features such as intensity (or energy), frequency, temporal features, pitch, timbre, FM direction or slope (called "orientation" here), etc. These features can be selected and implemented to mimic the receptive fields in the primary auditory cortex.

By way of example, and not by way of limitation, four features that can be included in the model to encompass the aforementioned features are intensity (I), frequency contrast (F), temporal contrast (T), and orientation ($O_\theta$) with $\theta=\{45°, 135°\}$. The intensity feature captures signal characteristics related to the intensity or energy of the signal. The frequency contrast feature captures signal characteristics related to spectral (frequency) changes of the signal. The temporal contrast feature captures signal characteristics related to temporal changes in the signal. The orientation filters are sensitive to moving ripples in the signal.

Each feature may be extracted using two-dimensional spectro-temporal receptive filters 309, 311, 313, 315, which mimic the certain receptive fields in the primary auditory cortex. FIGS. 3B-3F respectively illustrate examples of the receptive filters (RF) 309, 311, 313, 315. Each of the receptive filters (RF) 309, 311, 313, 315 simulated for feature extraction is illustrated with gray scaled images corresponding to the feature being extracted. An excitation phase 310 and inhibition phase 312 are shown with white and black color, respectively.

Each of these filters 309, 311, 313, 315 is capable of detecting and capturing certain changes in signal characteristics. For example, the intensity filter 309 illustrated in FIG. 3B may be configured to mimic the receptive fields in the auditory cortex with only an excitatory phase selective for a particular region, so that it detects and captures changes in intensity/energy over the duration of the input window of sound. Similarly, the frequency contrast filter 311 depicted in FIG. 3C may be configured to correspond to receptive fields in the primary auditory cortex with an excitatory phase and simultaneous symmetric inhibitory sidebands. The temporal contrast filter 313 illustrated in FIG. 3D may be configured to correspond to the receptive fields with an inhibitory phase and a subsequent excitatory phase.

Figure 3E:
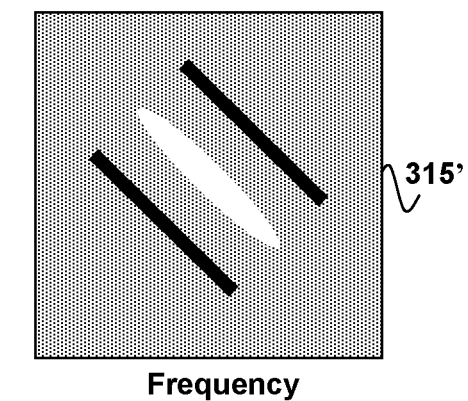
Figure 3F:
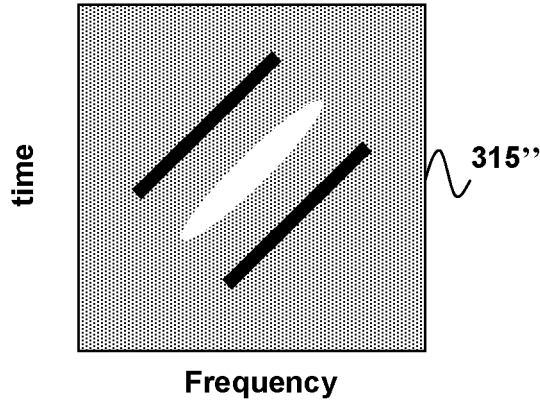

The frequency contrast filter 311 shown in FIG. 9C detects and captures spectral changes over the duration of the sound window. The temporal contrast filter 913 shown in FIG. 9D detects and captures changes in the temporal domain. The orientation filters 315' and 315" mimic the dynamics of the auditory neuron responses to moving ripples. The orientation filter 315' can be configured with excitation and inhibition phases having 45° orientation as shown in FIG. 3E to detect and capture when ripple is moving upwards. Similarly, the orientation filter 315" can be configured with excitation and inhibition phases having 135° orientation as shown in FIG. 9F to detect and capture when ripple is moving downwards. Hence, these filters also capture when pitch is rising or falling.

The RF for generating frequency contrast 311, temporal contrast 313 and orientation features 315 can be implemented using two-dimensional Gabor filters with varying angles. The filters used for frequency and temporal contrast features can be interpreted as horizontal and vertical orientation filters, respectively, and can be implemented with two-dimensional Gabor filters with 0° and 90°, orientations. Similarly, the orientation features can be extracted using two-dimensional Gabor filters with {45°, 135°} orientations. The RF for generating the intensity feature 309 is implemented using a two-dimensional Gaussian kernel.

The feature extraction 307 is completed using a multi-scale platform. The multi-scale features 317 may be obtained using a dyadic pyramid (i.e., the input spectrum is filtered and decimated by a factor of two, and this is repeated). As a result, eight scales are created (if the window duration is larger than 1.28 seconds, otherwise there are fewer scales), yielding size reduction factors ranging from 1:1 (scale 1) to 1:128 (scale 8). In contrast with prior art tone recognition techniques, the feature extraction 307 need not extract prosodic features from the input window of sound 301. After multi-scale features 317 are obtained, feature maps 321 are generated as indicated at 319 using those multi-scale features 317. This is accomplished by computing "center-surround" differences, which involves comparing "center" (fine) scales with "surround" (coarser) scales. The center-surround operation mimics the properties of local cortical inhibition and detects the local temporal and spatial discontinuities. It is simulated by across scale subtraction ($\theta$) between a "center" fine scale (c) and a "surround" coarser scale (s), yielding a feature map M (c, s): M (c, s)=|M(c) $\theta$M(s)|, M$\in$\{I, F, T, O$_\theta$\}. The across scale subtraction between two scales is computed by interpolation to the finer scale and point-wise subtraction.

Next, an "auditory gist" vector 325 may be extracted as indicated at 323 from each feature map 321 of I, F, T, O$_\theta$, such that the sum of auditory gist vectors 325 covers the entire input sound window 301 at low resolution. To determine the auditory gist vector 325 for a given feature map 321, the feature map 321 is first divided into an m-by-n grid of sub-regions, and statistics, such as maximum, minimum, mean, standard deviation etc., of each sub-region can be computed.

After extracting an auditory gist vector 325 from each feature map 321, the auditory gist vectors are augmented and combined to create a cumulative gist vector 327. The cumulative gist vector 327 may additionally undergo a dimension reduction 129 technique to reduce dimension and redundancy in order to make tone recognition more practical. By way of example and not by way of limitation, principal component analysis (PCA) can be used for the dimension reduction 329. The result of the dimension reduction 329 is a reduced cumulative gist vector 327' that conveys the information in the cumulative gist vector 327 in fewer dimensions. PCA is commonly used as a primary technique in pattern recognition. Alternatively, other linear and nonlinear dimension reduction techniques, such as factor analysis, kernel PCA, linear discriminant analysis (LDA) and the like, may be used to implement the dimension reduction 329.

Finally, after the reduced cumulative gist vector 327' that characterizes the input audio 301 (feature vector) has been determined, classification 329 by a neural network may be performed. More information on the computation of Auditory Attention features is described in commonly owned U.S. Pat. No. 8,676,574 the content of which are incorporated herein by reference.

In alternative embodiments, detected changes in, frequency, amplitude, or direction of the sound source can be feature vectors. These different types of features vectors may be used individually or together. Additionally these feature vectors may be used with the auditory attention features.

Classification Network

The classification neural network that implements the classification 329 may include one or more of several different types of neural networks and may have many different layers. By way of example and not by way of limitation the classification neural network may consist of one or multiple convolutional neural networks (CNN), recurrent neural networks (RNN) and/or dynamic neural networks (DNN).

FIG. 4A depicts the basic form of an RNN having a layer of nodes 420, each of which is characterized by an activation function S, one input weight U, a recurrent hidden node transition weight W, and an output transition weight V. It should be noted that the activation function S may be any non-linear function known in the art and is not limited to the (hyperbolic tangent (tan h) function. For example, the activation function S may be a Sigmoid or ReLu function. Unlike other types of neural networks, RNNs have one set of activation functions and weights for the entire layer. As shown in FIG. 4B the RNN may be considered as a series of nodes 420 having the same activation function moving through time T and T+1. Thus, the RNN maintains historical information by feeding the result from a previous time T to a current time T+1.

There are a number of ways in which the weights, U, W, V may be configured. For example input weights U may depend on which microphone produces the stronger signal, direction of arrival (DOA), the amplitude of the environmental sound signal, (ignore if far away), human presence, direction of movement of source, rate of movement of source, source frequency, bandwidth, the state of the mute button, mixing slider, or playback button. The weights for these different inputs could be stored in a lookup table and be applied as needed. There could be default values that the system applies initially. These may then be modified manually by the user or automatically by machine learning.

In some embodiments, a convolutional RNN may be used. Another type of RNN that may be used is a Long Short-Term Memory (LSTM) Neural Network which adds a memory block in a RNN node with input gate activation function, output gate activation function and forget gate activation function resulting in a gating memory that allows the network to retain some information for a longer period of time as described by Hochreiter & Schmidhuber "Long Short-term memory" Neural Computation 9(8):1735-1780 (1997), which is incorporated herein by reference.

FIG. 4C depicts an example layout of a convolution neural network such as a CRNN according to aspects of the present disclosure. In this depiction, the convolution neural network is generated for an image 432 with a size of 4 units in height and 4 units in width giving a total area of 16 units. The depicted convolutional neural network has a filter 433 size of 2 units in height and 2 units in width with a skip value of 1 and a channel 436 of size 9. For clarity in FIG. 4C only the connections 434 between the first column of channels and their filter windows is depicted. Aspects of the present disclosure, however, are not limited to such implementations. According to aspects of the present disclosure, the convolutional neural network that implements the classification 329 may have any number of additional neural network node layers 431 and may include such layer types as additional convolutional layers, fully connected layers, pooling layers, max pooling layers, local contrast normalization layers, etc. of any size.

Figure 4D:
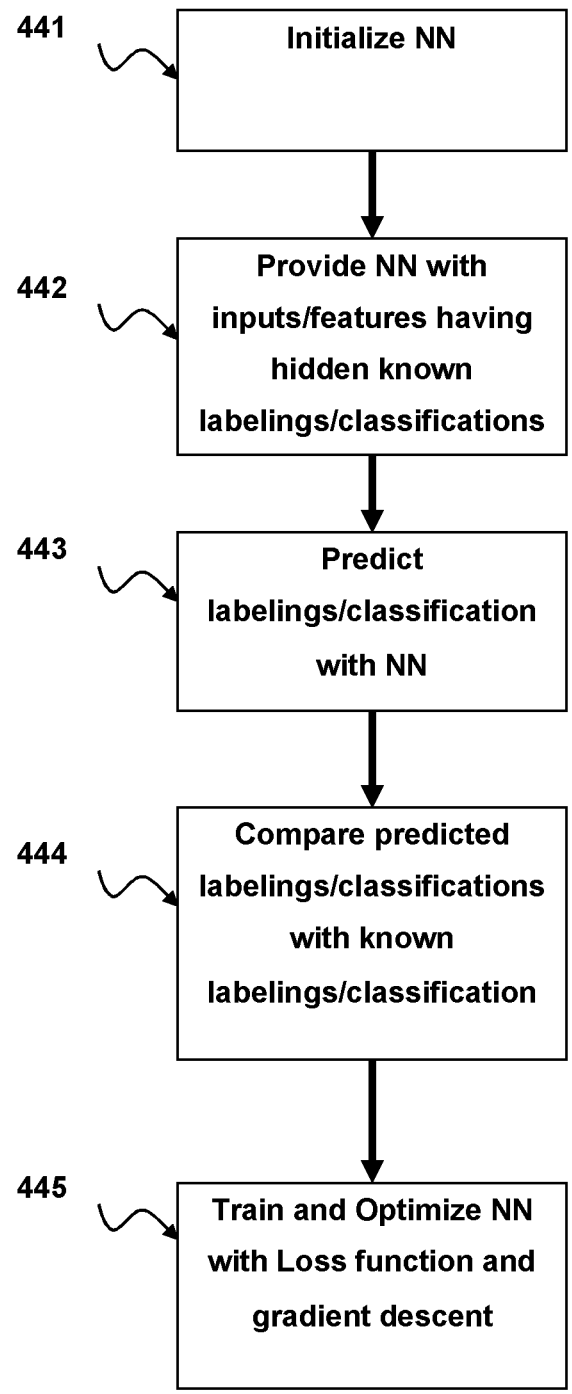
FIG. 4D is a block diagram of a method for training a neural network that is part of the multi-modal processing according to aspects of the present disclosure.

As seen in FIG. 4D Training a neural network (NN) begins with initialization of the weights of the NN 441. In general, the initial weights should be distributed randomly. For example, an NN with a tan h activation function should have random values distributed between $$-\frac{1}{\sqrt{n}} \text{ and } \frac{1}{\sqrt{n}}$$

where n is the number of inputs to the node.

After initialization the activation function and optimizer is defined. The NN is then provided with a feature or input dataset 442. Each of the different features vector may be provided with inputs that have known labels. Similarly, the Classification NN may be provided with feature vectors that correspond to inputs having known labeling or classification. The NN then predicts a label or classification for the feature or input 443. The predicted label or class is compared to the known label or class (also known as ground truth) and a loss function measures the total error between the predictions and ground truth over all the training samples 444. By way of example and not by way of limitation the loss function may be a cross entropy loss function, quadratic cost, triplet contrastive function, exponential cost, etc. Multiple different loss functions may be used depending on the purpose. By way of example and not by way of limitation, for training classifiers a cross entropy loss function may be used whereas for learning pre-trained embedding a triplet contrastive function may be employed. The NN is then optimized and trained, using the result of the loss function and using known methods of training for neural networks such as backpropagation with adaptive gradient descent etc. 445. In each training epoch, the optimizer tries to choose the model parameters (i.e., weights) that minimize the training loss function (i.e. total error). Data is partitioned into training, validation, and test samples.

During training, the Optimizer minimizes the loss function on the training samples. After each training epoch, the mode is evaluated on the validation sample by computing the validation loss and accuracy. If there is no significant change, training can be stopped. Then this trained model may be used to predict the labels of the test data.

Thus, the classification neural network may be trained from audio input having known labels or classifications to identify and classify those audio inputs. Where the classifications correspond to source types for example and without limitation vacuum cleaner, car, voice, dog barks, winds etc. According to additional aspects of the present disclosure, the classification NN may be trained to match sound source distance and direction information with audio features using labeled input data with known audio source distances and directions. According to other aspects of the present disclosure, the NN may simply be trained to classify audio inputs using known noises. Where the known noises correspond to a labeled training set and the audio inputs are generated from the labeled training set by hiding the labels for training.

In some implementations of the present disclosure, the classification NN may implement in-situ learning. In such implementations, the system may transduce an unclassified environmental sound, generate a feature vector and attempt to classify the environmental sound. The system may notify the user that the sound is unclassified and ask for the user's input to label the sound. The system may then use the user generated labels during operation for subsequent instances of this feature vector. In some embodiments, the system allows all unclassified sounds to be mixed with the source media signal and the user may provide the source label for the unclassified based on what is heard.

User feedback based on device behavior may be used for continued training. By way of example and not by way of limitation the user may label a previously unclassified feature vector representing an environmental sound signal as corresponding to the sound of an airplane. On subsequent occurrences of this feature vector, the system may notify the user of the detection of a low-confidence feature vector. The user's response as to whether system was correct in classification may then be used as a training data point. In other embodiments, the system may simply keep a list of low confidence feature vectors and wait for the user's input. In some embodiments, the system may record segments of low confidence feature vectors for playback during user input.

In some implementations, the device may be trained by itself using, by way of example and without limitation an autoencoder neural network layout. Autoencoders are trained using unsupervised learning. For this implementation, the autoencoder may be configured to reconstruct silence, speech or some other continuous sound from a noisy input. This reconstruction may inform the device of what filters to apply to the environmental sounds. For more information on denoising autoencoders, see Stowell, Dan & Turner, Richard. "Denoising without access to clean data using a partitioned autoencoder." arXiv preprint, arXiv:1509.05982, (2015).

Decision Fusion

Figure 5:
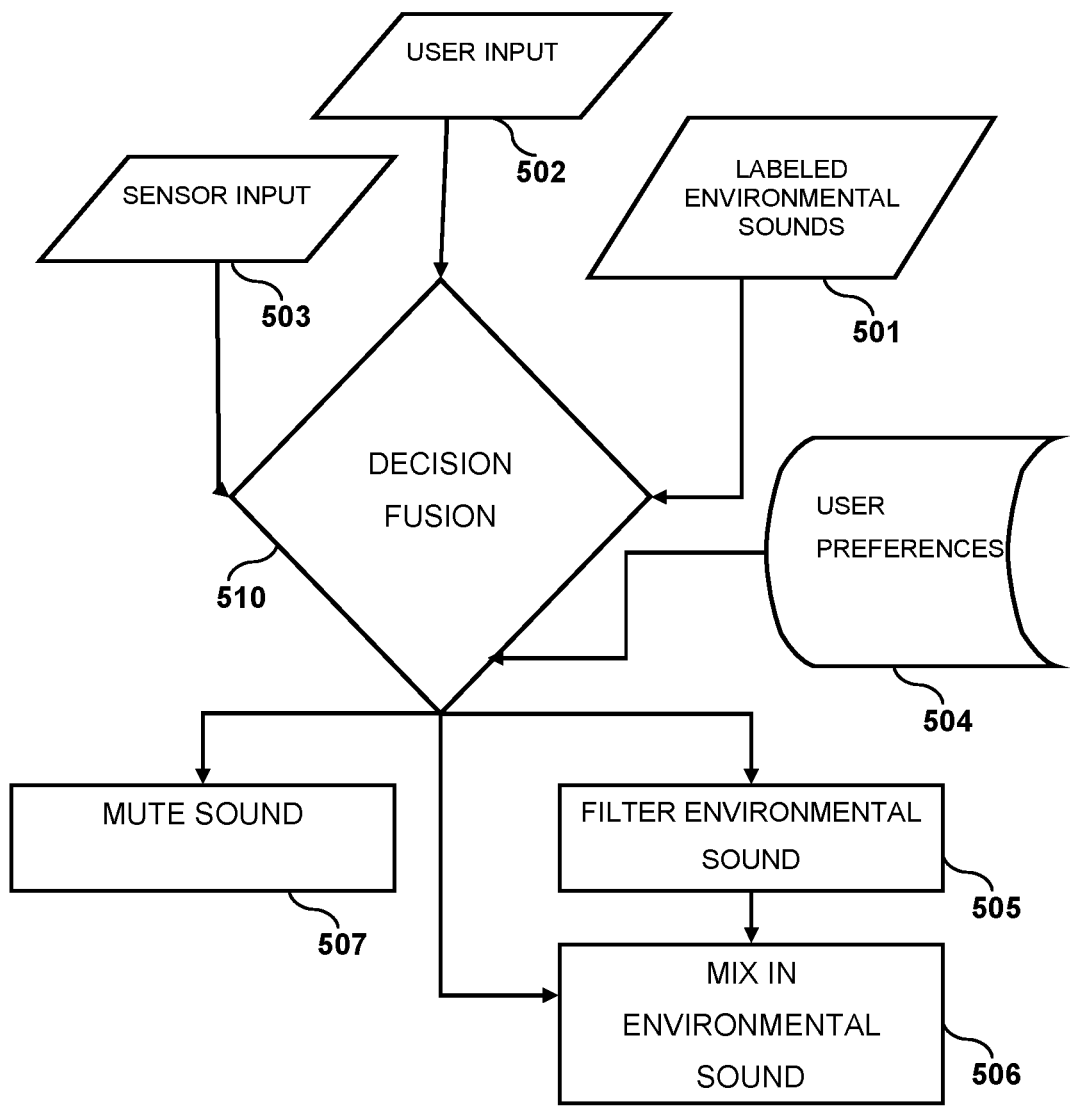
FIG. 5 is a flow diagram showing an example of decision fusion according to aspects of the present disclosure.

After classification, the labeled features 501 may be provided to decision fusion function 510 as shown in FIG. 5. The decision fusion function determines whether or not to mix the environmental sound with source media sound being supplied to a headset. The decision fusion function may be implemented in hardware, software, or some combination of hardware and software. In some implementations, the Decision Fusion function 510 may determine whether to mix in the environmental sound signal using a lookup table 504. By way of example and not by way of limitation the look up table 504 may contain a list of classifications for environmental sounds and/or sources known to the system along with user preferences for the handling of those classifications. For example, the list may contain such classifications as dog barking, vacuum cleaner, person talking close, person talking far, etc. The user preferences without limitation may include options such as mute when detected 507, mix-in when detected 506, reduce volume when detected 505, etc.

In some implementations, the decision fusion function 510 may receive user input 502. The user input 502 may include, without limitation, a mute button, volume knob, mixing slider or input from another device such as a smartphone. The fusion block 510 may further be configured to apply weights to the inputs received and the labels determined by the classification NN. In some implementations, these weights may be user-determined weights stored in a lookup table. In other implementations, there may be preset weights for some inputs or safety overrides. For example and without limitation the decision fusion block may apply an 80% weight to the mute button to mute all environmental sounds but a 100% weight to environmental sound sources labeled as police sirens to play environmental sounds. Thus, the system would override the mute button when a police siren was detected in the environmental sounds and mix-in all the environmental sounds. Additionally the weighting may use distance and direction information determined either before classification or environmental sounds labeled with distance and direction after classification, for weighting. For example and without limitation continuing the example from above the system may apply a heavy weight such as 90% when a sound source location labeled as a car is determined to be moving towards the user. Thus, the system would over-ride the mute button and mix-in environmental sounds when an environmental sound source labeled as a car is detected to be moving towards the user. In some implementations, there may be different weighting modes that would apply different weights depending on the setting or environment. By way of example and without limitation the modes may include a Game mode, movie mode, outdoor mode etc. These different modes may mix-in or block out different sets of sound based on their intended purpose for example and without limitation, an outdoor mode may apply a heavy weight to car sounds while a movie mode would set a light weight to car sounds. Additionally the different weighting modes may be adjusted or further refined by the weighting neural network.

A volume knob may determine the magnitude of the environmental sound signal mixed with the source media sound signal. The volume knob may manipulate the amplitude of the environmental sound signals or modify weights applied to the classified environmental sounds such that when the volume is high; a modifier applied to the weights of labeled environmental sounds allows lower weighted environmental sounds to play at full magnitude and when the volume is low; only very heavily weighted labeled environmental sounds play at full magnitude. In some implementations, the volume knob may control the overall amplitude of the mixed source media signals and environmental sounds. In other implementations, the volume knob may control the amplitude of the source media signal.

The mixing slider may choose the weight applied to source media signal and the weight applied to the environmental sound signals similar to the function of the volume knob. These weights may also determine the relative amplitude of the signals mixed normalized to an overall volume level.

Aspects of the present disclosure envisage situations in which sounds may be created near the user that should or should not cause the mix of audio to be changed. Such situations may include a dog barking, a doorbell or phone ringing. The decision fusion function 510 may be configured to recognize such situations and filter 505, mix 505, or mute 507 the environmental sound. In some implementations the decision fusion function 510 may also trigger an augmentation of mixing of environmental sound, e.g., by presenting text on a display screen or by piping the telephone audio into the headset.

In some embodiments, the system may be configured to notify the user if certain sounds are detected. By way of example and not by way of limitation, the look up table 504 may contain a notify setting. The notify setting in the decision fusion function 510 may be configured to cause the system to play a certain sound or a voice cue when an environmental sound 501 is classified to be from a particular source. For example, an entry for baby crying may be set to always notify, in this instance, a voice may be played through the headset that notifies the user that a baby is crying. In this way, the headphones may provide situational awareness cues to the listener while avoiding a harsh disruption to the listening experience.

According to additional aspects, the decision fusion block 510 may receive other input information from sensors 503 connected or coupled to the system. This information for example, may be locational information from, traditional cameras, infra-red cameras or structured light cameras, positional information from accelerometers, GPS, or gyroscopic position sensors or relational information from wireless communication devices. Similar to the mute button a weight may be applied to the other input data and used in the determination of whether to mix in sounds 510. By way of example and not by way of limitation when a camera connected to the system detects another person near the user the system may apply a heavier weight to environmental sounds.

In some implementations, the decision fusion 510 may be provided by a weighting neural network trained to provide weights based on the classification of the source of the environmental sound. The weighting neural network may have an in-situ training component. The in-situ training component allows the weighting NN to learn to apply weights to different sound input types based on user feedback 502. User input 502 may be used to provide labels for training. By way of example and not by way of limitation the system may detect and classify a sound source, the system may then notify the user of the sound source and the neural network in decision fusion 510 may use the user input 502 as a training point. When that sound is detected and classified 501, again the NN may predict whether the user will select the user input corresponding to, by way of example and not limitation, mixing-in or not mixing-in the sound. The prediction is then checked with the actual user input 502 and the NN is trained based on this information. After several rounds of correct prediction, the system may cease notifying the user of the sound source and rely solely on the prediction made by decision fusion 510. In alternative embodiments, the NN may be trained initially to mix in all sounds and when the user mutes a sound, the system may use that information as an initial training point. Thereafter, the system may begin predicting whether to mute a sound source based on previous user responses. After several correct predictions, the system may begin relying on NN predictions instead of mixing in the sound. In some implementations, the weighting NN may be combined with a look-up table as described above. In such implementations, the NN modifies preset or user set weights after user feedback.

Selective Mixing

According to further aspects of the present disclosure, the decision fusion function 510 may apply different filters to the environmental sounds 505 based on classification of the source of the environmental sound. By way of example and not by way of limitation when the system classifies environmental sounds as containing a voice, the decision fusion function 510 may signal the system to apply a pass-band filter at voice frequency (100 Hz-8 kHz) to filter out other noises while retaining the speech. As another non-limiting example if the system classifies a siren in the environmental sounds the decision fusion function 510 may signal the system to apply a pass-band filter for 1 kHz-2 kHz to filter out other environmental sounds while retaining the siren. While filters allowing the passage of certain sounds have been described, the invention is not limited to such filters for example a stop-band filter may be applied to attenuate sounds in the range of around 500 Hz-8 kHz to remove dog barking. Filters may be chosen based on the source type or customized according to user preferences. In some embodiments, the classification neural network may be able to associate a classified sound source with a frequency range and the filters may be modified to attenuate or mix-in that sound based on the classification and associated frequency range.

In other implementations, sound may be filtered based on the location of its source. For example if the system classifies a voice sound source near the left microphone of the headset a filter may be applied to all sounds determined to be coming from areas other than the left side of the headset. This may be accomplished by using coherence based sound-detection technology as discussed above and applying filters based on the determined locations. According to additional aspects of the present disclosure, the system may use a change in the direction and distance of a sound source to track a moving sound source and apply filters.

Returning to FIG. 1, the sound processor 113 convert's environmental sounds into environmental signals and performs sound source classification while simultaneously generating a multi-channel environmental sound signal 115. The multi-channel environmental sound signal 115 is mixed with the source media sound signal 101 from the media device 103 after filtering, classification, and decision fusion. The resulting mixed multi-channel signal 107 is played over the speakers in the headset 102. Thus, environmental sounds from the sound source 108 can be readily perceived by a person wearing the headset and listening to source media sound from the media device 103. The environmental sound reproduced in the headset can have a directional quality resulting from the use of multiple microphones and multi-channel sound generation. Consequently, the headset-wearer could perceive the sound coming from the speakers 106A, 106B as though it originated from the specific location of the sound source 108 in the room as opposed to originating from the media device 103.

Figure 2:
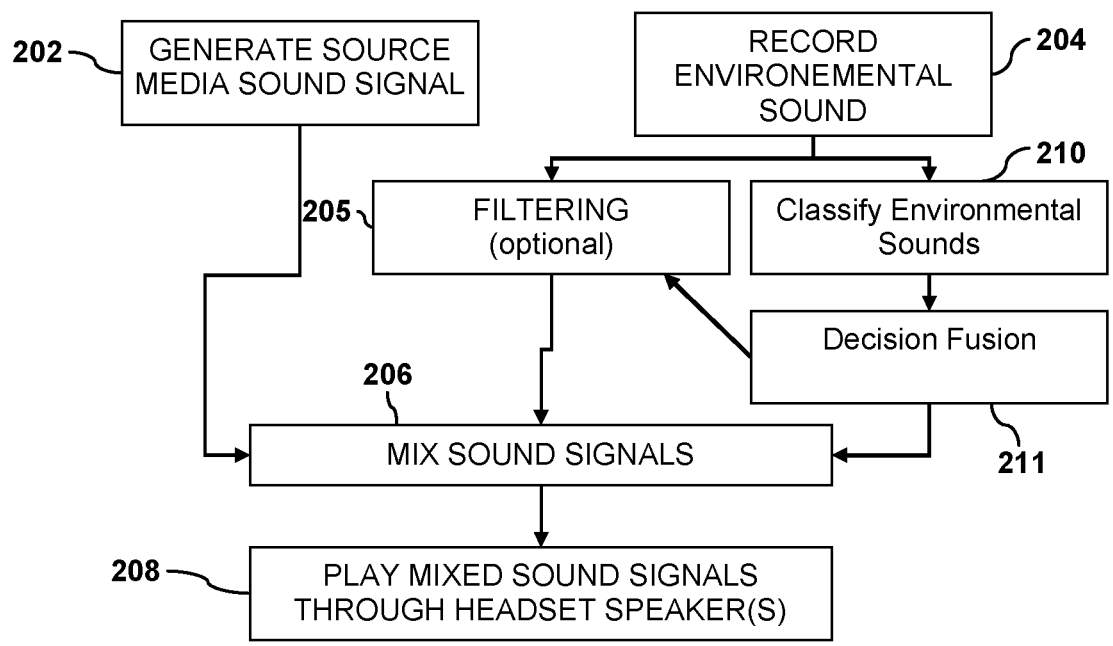
FIG. 2 is a flow diagram illustrating classification and selective mixing of sound according to an embodiment of the present invention.

FIG. 2 illustrates a flow diagram of a method 200 for sound detection and generation in an audio system of the type shown in FIG. 1. Specifically, at 202 source media sound signals are generated, e.g., from a music player, video player, or video game device. Environmental sound is recorded with one or more headset microphones, to produce an environmental sound signal as indicated at 204. Noise reduction and unwanted sound filtering may be performed on the recorded environmental sound signal, as indicated at 205 and as discussed above. Delay filtering may be used to determine the location of a particular source of sound within the environmental sound signal. The location of a particular sound within an environmental sound signal may be provided as part of a feature vector for classification. Additional feature vectors may be extracted from the Environmental sound using methods such as Audio Attention features. Classification 210 of sound sources may be performed on the environmental sound signal represented by the extracted features. In some embodiments, filtering 205 may be determined by the classification 210. From the classification determined at 210, decision fusion 211 determines whether or not the environmental sound signal is mixed with the source media as well as the magnitude of the environmental signal mixed with the source media signal during the mixing step 206 The recorded environmental sound signal (with or without noise reduction and unwanted sound filtering) is then mixed with the source media sound signal, as indicated at 206, thereby producing a mixed sound containing both the source media sound and the environmental sound. By way of example, if the source media sound is a 5.1 channel surround sound signal, the targeted sound from the particular source may be mixed with the source media sound as a 5.1 channel signal and mixed with the source media signal. The mixed sound is played over one or more speakers in the headset as indicated at 208.

It is noted that aspects of the present disclosure include the possibility that the headset 102 may have a single far-field microphone. In such a case, the signal from the single microphone may be mixed to all of the channels of a multi-channel source media signal. Although, this may not provide the headset user with a full multi-channel sound experience for the environmental sounds, it does allow the headset user to perceive targeted environmental sounds while still enjoying a multi-channel sound experience for the source media sounds.

Machine learning may takes some finite amount of time. In such cases, it can be desirable to delay enabling the mixer by a similar finite amount of time so that the machine has enough information to produce reliable results. In some implementations, the system could pre-learn sounds to mix or to ignore. Specifically, safety considerations may warrant a faster response for certain sounds, e.g., if the source of sound is moving toward the user. For example, if the user is outdoors, certain sounds, the system could be trained to mute certain sounds, e.g., general traffic sounds, but to mix in more specific sounds associated with particular danger, e.g., a car horn heading toward the user.

Figure 6A:
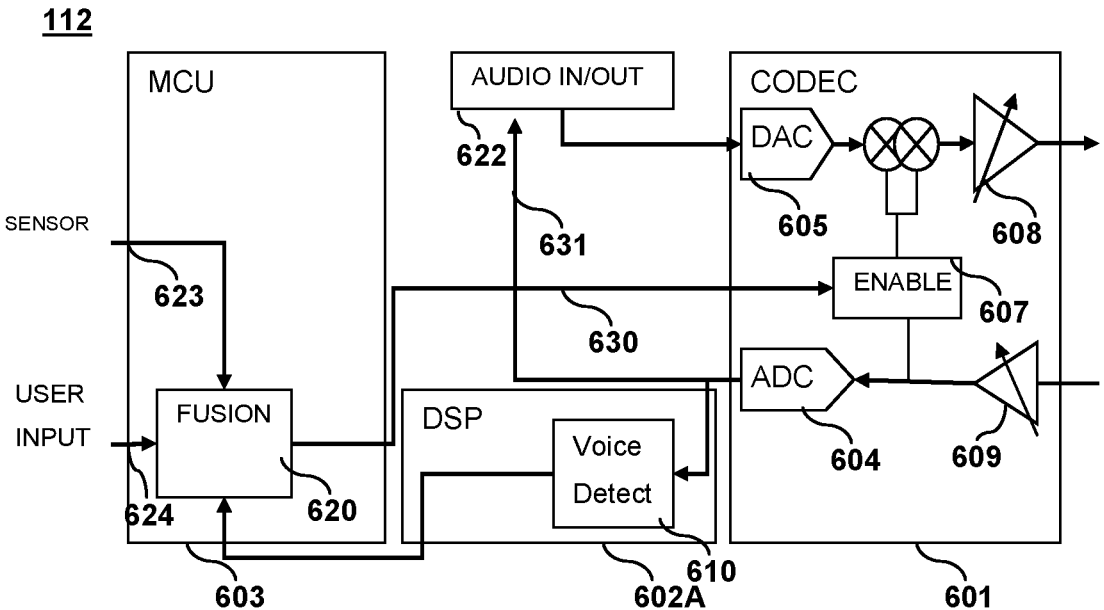
FIGS. 6A-6C are block diagrams showing example configurations of a signal processor according to aspects of the present disclosure.
Figure 6B:
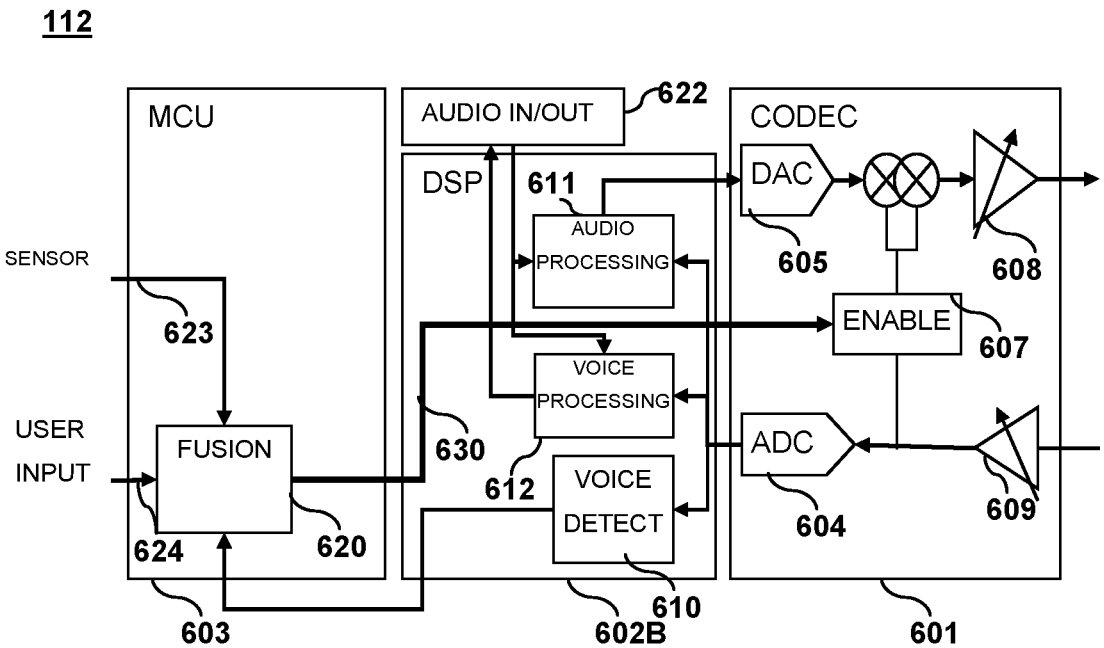
Figure 6C:
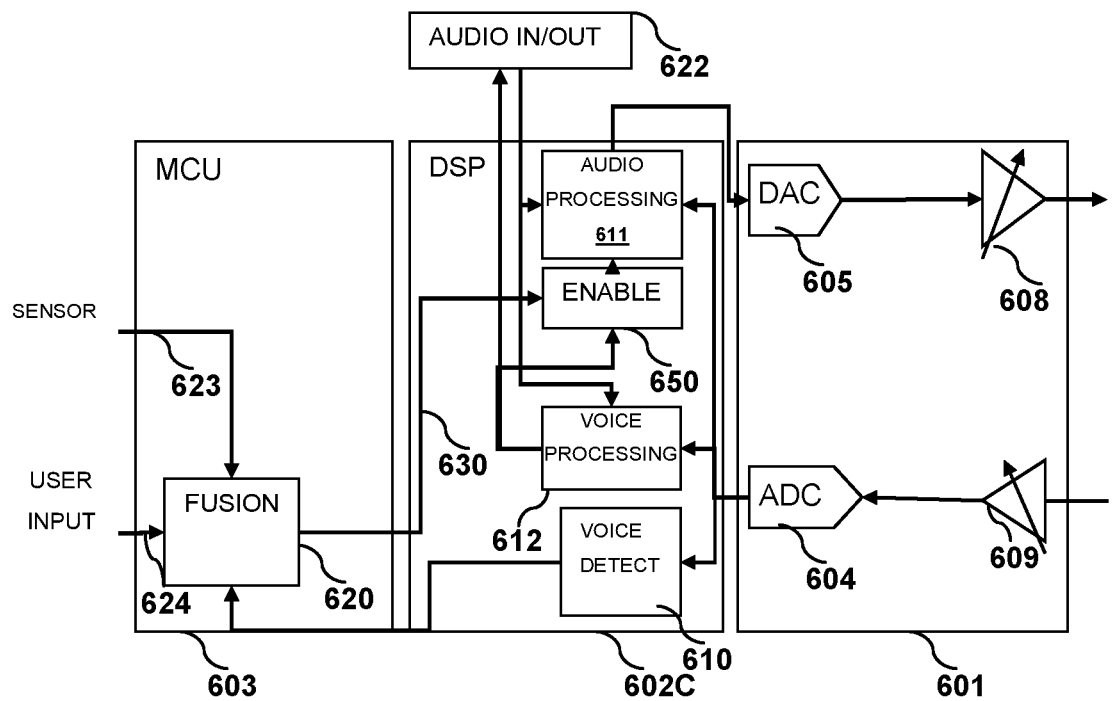

FIGS. 6A-6C show some different possible implementations of the sound processor 113. The sound processor 113 may generally include a coder/decoder (Codec) 601, a Digital Signal Processor (DSP) 602, and a Micro Controller Unit (MCU) 603 the sound processor may also be in communication with, and receive information and instructions from, a source media device 622 such as a computer or a game console without limitation. The Codec 601 may receive analog environmental sound signals 609 from one or more microphones 110A and 110B. The Analog to Digital Converter (ADC) 604 converts the analog environmental sound signals to digital sound signals. Conversely, the Digital to Analog converter (DAC) 605 converts digital multichannel audio signals to analog multichannel audio signals, which may subsequently be played through a speaker 608. In the embodiment shown in FIGS. 6A and 6B, the analog environmental signals 609 are mixed with the multi-channel audio signal and delivered to the speakers 608. Before mixing, an enabling block 607 may enable or disable mixing of the analog environmental signals with the multichannel audio signals. In some embodiment, filters to remove noise and/or unwanted sounds are applied to the analog audio signal at the enable block 607. In these embodiments, the enable block receives instructions 630 from decision fusion performed in the fusion block 620. The instructions 630 tell the enable block to enable and or disable mixing. The instruction 630 may also instruct the enabling block to decrease or increase the amplitude of the analog environmental sound signals before mixing. Additionally the instruction 630 may tell the enable block 607 what filters to apply to the analog environmental sound signals. In FIG. 6A and FIG. 6B latency is reduced by mixing the analog environmental sound with the multi-channel audio signals before delivery to the speakers 608. FIG. 6C moves the enable step to the DSP 650 and allows more in depth processing and filtering of the Environmental sounds as the analog environmental signals are converted to digital signals 604 before mixing which is performed during digital audio processing 611.

FIG. 6A depicts an embodiment with a simplified DSP 602A. The Simplified DSP 602A comprises a Voice Detect block 610. The voice detect block 610 may process the digital environmental audio signals to extract feature vectors. The feature vectors of the environmental audio signal may then be provided to a neural network in the voice detect block 610. The neural network may classify the sounds within the environmental audio to detect voices but embodiments are not limited to voices. As discussed above the neural network within the voice detect block may be trained to recognize and classify a multitude of different sounds within environmental audio. The classification of different sounds by the neural network can also be thought of as classifying the sound as coming from a particular source. As such, the result of the classification is provided to the MCU to decide if mixing is warranted as will be discussed in a later section. The voice detect block 610 may additionally implement features such as, without limitation, key word detection, voice command detection user voice recognition, etc. In FIG. 6B the intermediate DSP 602 comprises voice processing 612 and audio processing 611 blocks. The voice processing block 612 may perform coherence based sound detection methods as discussed above as well as without limitation, noise cancellation, echo cancellation and other audio clarifying operations. The audio processing block 611 may further process the multichannel audio signal and perform some sound equalization or normalization, active noise cancellation and filtering with respect to the environmental audio. The audio processing block receives a multichannel audio signal from a media device 622 and may also receive the digital environmental audio signal from the ADC 604. The audio processing block may manipulate aspects these signals for a better sound experience. As discussed above, in FIG. 6C the enabler block 655 has been moved the DSP 602C. In this embodiment, the mixing of the environmental sound and the multichannel audio is performed by the Audio Processing block 611.

In FIG. 6A-6C, the MCU 603 and the fusion block 620. The Fusion block may receive inputs from sensors 623 and/or user input 624. As discussed above the user input may be from a button, volume knob, touch screen, mixer knob, touch pad, gestures or from another device such as a smartphone in communication with the system. As disclosed above the user input 624 controls the mixing of the environmental audio with the multichannel audio. In some embodiments, the user input may generate training data for a neural network configured to predict user preferences as disclosed above. The sensors 623 may be traditional cameras, infra-red cameras, structured light sensor cameras, accelerometers, GPS, gyroscopic position sensors, radio frequency (RF) markers, Magnetometers, RF radar, Time of Flight, etc.

In some implementations, audio processing block 611 in the digital signal processor 602B, 602C may implement acoustic beamforming to isolate specific sources of sound. In some such implementations the voice detection block 610 and voice processing block 612 may be configured to identify certain specific sources of sound as corresponding to different individuals who are speaking. In such implementations, the user input 624 may allow the enable block 650 to selectively mix in sounds from one such person while muting others, e.g., in a so-called "tap to toggle" configuration.

Figure 7:
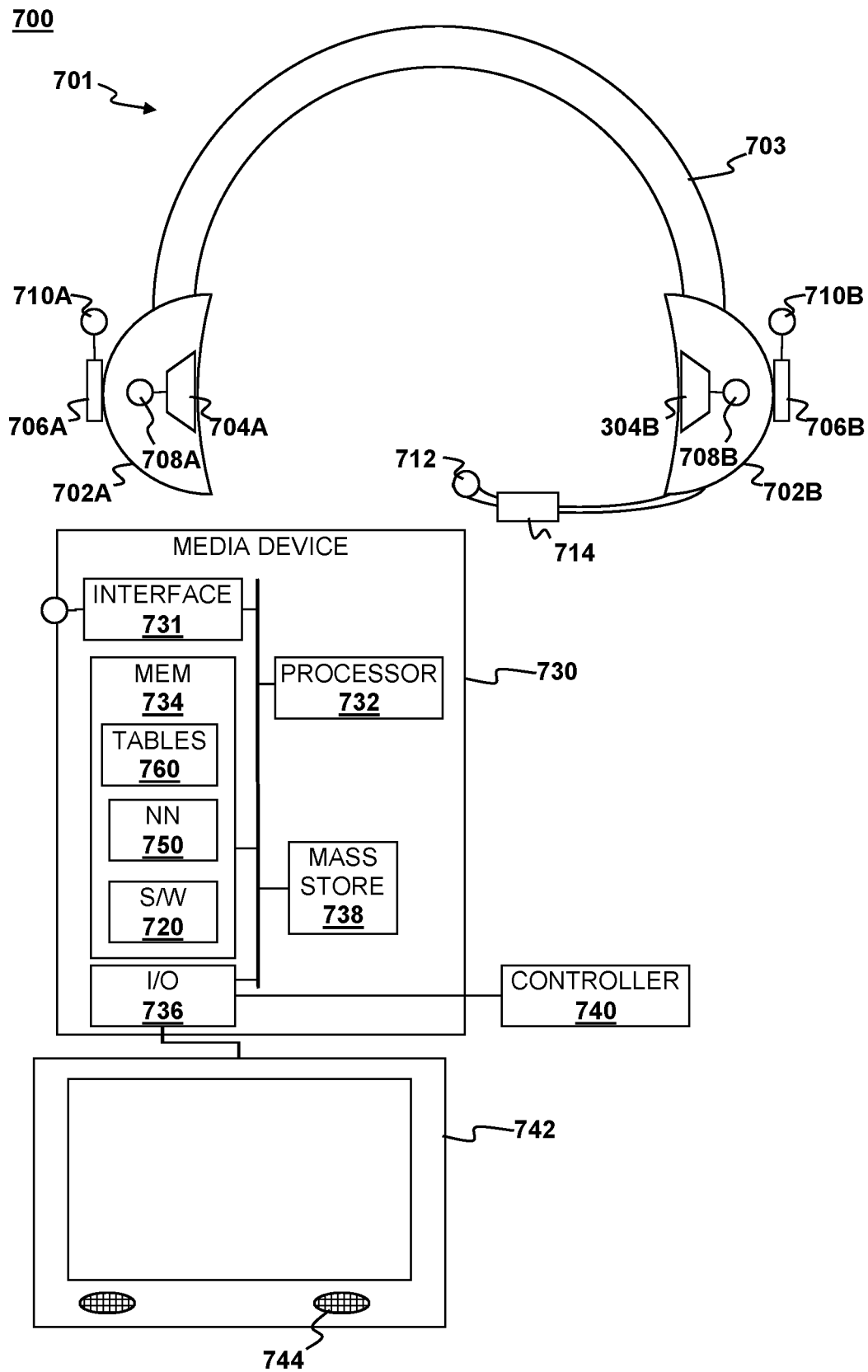
FIG. 7 is a schematic diagram of an audio system utilizing according to an embodiment of the present invention.

According to an alternative embodiment of the present invention, ambient sound activated headphone system may be implemented an audio system 700, which may be configured as shown in FIG. 7. The system 700 may include a headset 701 that is interoperable with a media device 730. The headset 701 may include a headpiece such as one or more headphones 702A, 702B, each containing one or more speakers 704A, 704B. In the example depicted in FIG. 7, speakers 704A, 704B are respectively positioned and oriented on the earphones 702A, 702B such that they direct sound toward a user's ears when the user wears the headset. The two earphones 704A, 704B may be mechanically connected to each other by a resilient headband 703 to facilitate mounting of the headset to a user's head. Alternatively, the earphones 702A, 702B may be separately mountable to a user's ears. One or more far-field microphones 706A, 706B may be mounted to the headpiece 701. In the example depicted in FIG. 7, microphones 706A, 706B are respectively mounted to earphones 702A, 702B. The microphones 706A, 706B are positioned and oriented on the earphones 702A, 702B such that they can readily detect sound originating outside the earphones when the user wears the headset.

The headset 701 may include speaker communication interfaces 708A, 708B that allow the speakers to receive source media signals from the source media device 730. The speaker communication interfaces 708A, 708B may be configured to receive signals in digital or analog form from the source media device 730 and convert them into a format that the speakers may convert into audible sounds. Similarly, the headset 701 may include microphone communication interfaces 710A, 710B coupled to the microphones 706A, 706B. The microphone communication interfaces 710A, 710B may be configured to receive digital or analog signals from the microphones 706A, 706B and convert them into a format that can be transmitted to the media device 730. By way of example, any or all of the interfaces 708A, 708B, 710A, 710B may be wireless interfaces, e.g., implemented according to a personal area network standard, such as the Bluetooth standard. Furthermore, the functions of the speaker interfaces 708A, 708B and microphone interfaces 710A, 710B may be combined into one or more transceivers coupled to both the speakers and the microphones.

In some embodiments, the headset 701 may include an optional near-field microphone 712, e.g., mounted to the band 703 or one of the earphones 702A, 702B. The near-field microphone may be configured to detect speech from a user of the headset 700, when the user is wearing the headset 701. In some embodiments, the near-field microphone 712 may be mounted to the band 703 or one of the earphones 702B by a stem 713 that is configured to place the near-field microphone in close proximity to the user's mouth. The near-field microphone 712 may transmit signals to the media device 730 via an interface 714.

As used herein, the terms "far-field" and "near-field" generally refer to the sensitivity of microphone sensor, e.g., in terms of the capability of the microphone to generate a signal in response to sound at various sound wave pressures. In general, a near-field microphone is configured to sense average human speech originating in extremely close proximity to the microphone (e.g., within about one foot) but has limited sensitivity to ordinary human speech originating outside of close proximity. By way of example, the near-field microphone 712 may be a −46 dB electro-condenser microphone (ECM) sensor having a range of about 1 foot for average human voice level.

A far-field microphone, by contrast, is generally sensitive to sound wave pressures greater than about −42 dB. For example, the far-field microphones 706A, 706B may be ECM sensors capable of sensing −40 dB sound wave pressure. This corresponds to a range of about 20 feet for average human voice level.

It is noted, there are other types of microphone sensors that are potentially capable of sensing over both the "far-field" and "near-field" ranges. Any sensor may be "far-field" as long as it is capable of sensing small wave pressure, e.g., greater than about −42 db).

The definition of "near-field" is also meant to encompass technology, which may use many different approaches to generating a signal in response to human speech generated in close proximity to the sensor. For example, a near-field microphone may use a material that only resonates if sound is incident on it within some narrow range of incident angles. Alternatively, a near-field microphone may detect movement of the bones of the middle ear during speech and re-synthesizes a sound signal from these movements.

The media device may be any suitable device that generates source media sounds. By way of example, the media device 730 may be a television system, home theater system, stereo system, digital video recorder, video cassette recorder, video game console, portable music or video player or handheld video game device. The media device 730 may include an interface 731 (e.g., a wireless transceiver) configured to communicate with the speakers 702A, 702B, the microphones 706A, 706B and 712 via the interfaces 708A, 708B, 710A, 710B and 714.

The media device 730 may further include a computer processor 732, and a memory 734, which may both be coupled to the interface 731. The memory may contain software 720 and that is executable by the processor 732, lookup tables with user preferences for decision fusion 760 and neural network information 750 such as node weights and transition values. The software 720 may implement targeted sound source detection and generation in accordance with embodiments of the present invention as described above. Specifically, the software 720 may include instructions that are configured such that when executed by the processor, cause the system 700 to record environmental sound using one or both far-field microphones 710A, 710B, classify the source environmental sound, determine whether to mix the environmental sound based on the classification of the source, mix the environmental sound with source media sound from the media device 730 to produce a mixed sound, and play the mixed sound over one or more of the speakers 704A, 704B. The media device 730 may include a mass storage device 738, which may be coupled to the processor and memory. By way of example, the mass storage device may be a hard disk drive, CD-ROM drive, Digital Video Disk drive, Blu-Ray drive, flash memory drive, and the like that can receive media having data encoded therein formatted for generation of the source media sounds by the media device 730. By way of example, such media may include digital video disks, Blu-Ray disks, compact disks, or video game disks. In the particular case of video game disks, at least some of the source media sound signal may be generated as a result a user playing the video game. Video game play may be facilitated by a video game controller 740 and video monitor 742 having speakers 744. The video game controller 740 and video monitor 742 may be coupled to the processor 732 through input/output (I/O) functions 736.

While the above is a complete description of the preferred embodiment of the present invention, it is possible to use various alternatives, modifications and equivalents. It is to be understood that the above description is intended to be illustrative, and not restrictive. For example, while the flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled. Any feature described herein, whether preferred or not, may be combined with any other feature described herein, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. In a device having at least one microphone coupled to the device; and
   one or more speakers mounted to the device, a method for sound detection and generation, the method comprising:
   recording environmental sound using the at least one microphone;
   classifying a source of the recorded environmental sound;
   determining whether to mix the recorded environmental sound based on the classification of the source;
   mixing the recorded environmental sound with source media sound based on the determined result to produce a mixed sound; and
   playing the mixed sound over the one or more speakers.

2. The method of claim 1 wherein the at least one microphone includes two or more microphones and the one or more speakers include two or more speakers.

3. The method of claim 2 wherein mixing the recorded environmental sound with source media sound includes generating a multi-channel sound that includes ambient room sounds.

4. The method of claim 3 wherein the multi-channel sound includes five sound channels.

5. The method of claim 4 wherein the two or more speakers include five or more speakers.

6. The method of claim 1 wherein the source media sound includes sound generated by a television system, home theater system, stereo system, digital video recorder, video cassette recorder, video game console, portable music or video player or handheld video game device.

7. The method of claim 1 wherein the at least one microphone is configured to detect ambient noise.

8. The method of claim 1, further comprising performing noise reduction on the environmental sound after it has been recorded and before mixing it with the source media sound.

9. The method of claim 1 wherein classifying the source of the recorded environmental sounds includes converting the recorded environmental sound into digital data representing the recorded environmental sound.

10. The method of claim 9 wherein classifying the source of the recorded environmental sounds includes providing the digital data representing the recorded environmental sound to a neural network trained to predict a class for the source of the recorded environmental sound wherein the classes are sound source types.

11. The method of claim 10 wherein classifying the source of the recorded environmental sound further includes using coherence based sound-detection technology to calculate the direction-of-arrival of the environmental sound recorded by the two or more microphones and wherein mixing retains the direction-of-arrival of the environmental sound.

12. The method of claim 10 further comprises training the neural network to classify the source of the recorded environmental sound based on a user input.

13. The method of claim 1 wherein determining whether to mix the recorded environmental sound comprises looking up in a look-up table a user preference for mixing in, the classification of the source of the recorded environmental sound.

14. The method of claim 1 wherein determining whether to mix the recorded environmental sound comprises weighting a user input and the classification of the source of the recorded environmental sound.

15. The method of claim 13 wherein determining whether to mix the recorded environmental sound includes providing the classification of the source of the recorded environmental sound and a user input to an untrained neural network and training the neural network to weight classifications based on the user input and wherein the recorded environmental sound is mixed in based on the applied weight.

16. The method of claim 1 further comprises applying filters to the recorded environmental sound based on the classification of the source of the recorded environmental sound before mixing.

17. The method of claim 1 wherein the mixing the recorded environmental sound further comprises adding a sound cue based on the classification of the source of the recorded environmental sound.

18. An audio system, comprising:
a headset, adapted to mount to a user's head, having at least one microphone mounted to the headset; and one or more speakers mounted to the headset, a processor coupled to the at least one microphone and the one or more speakers;
a memory coupled to the processor;
a set of processor-executable instructions embodied in the memory, wherein the instructions are configured, when executed by the processor to implement a method for sound detection and generation, wherein the method comprises:
recording environmental sound using the at least one microphone;
classifying a source of the recorded environmental sound;
determining to mix the recorded environmental sound based on the classification of the source;
mixing the recorded environmental sound with source media sound based on the determined result to produce a mixed sound; and
playing the mixed sound over the one or more speakers.

19. The system of claim 18 wherein mixing the recorded environmental sound with source media sound include multi-channel sound that includes the ambient room sounds.

20. The system of claim 18 wherein the multi-channel sound includes five sound channels.

21. The system of claim 18 wherein the processor is located on a console device, the system further comprising a wireless transceiver on the console device coupled to the processor, a wireless transmitter mounted to the headset coupled to the one or more microphones, and a wireless receiver mounted to the headset coupled to the one or more speakers.

22. The system of claim 18 wherein the one or more microphones are configured to detect environmental sounds originating outside the headset.

23. The system of claim 22 wherein the at least one microphone is configured to detect environmental sounds originating outside the headset while a user is wearing the headset.

24. The method of claim 18 wherein classifying the source of the recorded environmental sounds includes converting the environmental sound into digital data representing the environmental sound.

25. The system of claim 24 wherein classifying the source of the recorded environmental sounds includes providing the digital data representing the recorded environmental sound to a neural network trained to predict a class for the source of the environmental sound wherein the classes are sound source types.

26. The system of claim 25 wherein classifying the source of the recorded environmental sound further includes using coherence based sound-detection technology to calculate the direction-of-arrival of the environmental sound recorded by the at least one microphone and wherein mixing retains the direction-of-arrival of the environmental sound.

27. The system of claim 25, further comprising training the neural network to classify the source of the recorded environmental sound based on a user input.

28. The system of claim 18 wherein determining whether to mix the recorded environmental sound comprises looking up in a look-up table a user preference for mixing in, the classification of the source of the recorded environmental sound.

29. The system of claim 18 wherein determining whether to mix the recorded environmental sound comprises weighting a user input and the classification of the source of the recorded environmental sound.

30. The system of claim 28 where determining whether to mix the recorded environmental sound includes providing the classification of the source of the recorded environmental sound and a user input to an untrained neural network and training the neural network to weight classifications based on the user input and wherein the recorded environmental sound is mixed in based on the applied weight.

31. The system of claim 18 further comprises applying filters to the recorded environmental sound based on the classification of the source of the recorded environmental sound before mixing.

32. A non-transitory computer-readable medium having a set of processor-executable instructions embodied therein, wherein the processor-executable instructions are configured, when executed by the processor to implement a method for sound detection and generation, wherein the method comprises:
   recording environmental sound using at least one microphone;
   classifying a source of the recorded environmental sound;
   determining to mix the recorded environmental sound based on the classification of the source;
   mixing the recorded environmental sound with source media sound based on the determined result to produce a mixed sound; and
   playing the mixed sound over one or more speakers.

* * * * *